(12) United States Patent
Noquil et al.

(10) Patent No.: US 11,081,472 B2
(45) Date of Patent: Aug. 3, 2021

(54) STACKED DIE MULTICHIP MODULE PACKAGE

(71) Applicant: Texas Instruments Incorporated, Dallas, TX (US)

(72) Inventors: Jonathan Almeria Noquil, Plano, TX (US); Makarand Ramkrishna Kulkarni, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/574,226

(22) Filed: Sep. 18, 2019

(65) Prior Publication Data

US 2021/0082889 A1    Mar. 18, 2021

(51) Int. Cl.
| | | |
|---|---|---|
| *H01L 25/16* | (2006.01) | |
| *H01L 23/498* | (2006.01) | |
| *H01L 23/00* | (2006.01) | |
| *H01L 23/31* | (2006.01) | |
| *H01L 23/538* | (2006.01) | |

(52) U.S. Cl.
CPC .......... *H01L 25/16* (2013.01); *H01L 23/3185* (2013.01); *H01L 23/49822* (2013.01); *H01L 23/49844* (2013.01); *H01L 23/5383* (2013.01); *H01L 23/5386* (2013.01); *H01L 24/97* (2013.01)

(58) Field of Classification Search
CPC .......... H01L 23/3185; H01L 23/49844; H01L 23/5383; H01L 23/5386; H01L 25/16; H01L 24/97
See application file for complete search history.

(56) References Cited

U.S. PATENT DOCUMENTS

| | | | |
|---|---|---|---|
| 10,567,065 B2* | 2/2020 | Kundargi | H04W 72/085 |
| 2013/0256861 A1* | 10/2013 | Do | H01L 23/28 |
| | | | 257/676 |
| 2013/0285260 A1 | 10/2013 | Denison et al. | |
| 2014/0167236 A1* | 6/2014 | Do | H01L 21/56 |
| | | | 257/676 |
| 2017/0069558 A1* | 3/2017 | Bang | H01L 24/14 |
| 2020/0258803 A1* | 8/2020 | Bang | H01L 23/3128 |

* cited by examiner

*Primary Examiner* — Seahvosh Nikmanesh
(74) *Attorney, Agent, or Firm* — Ronald O. Neerings; Charles A. Brill; Frank D. Cimino (57) ABSTRACT

A multichip module (MCM) power package includes a multilayer routable leadframe substrate (MRLF) substrate including a first and a second RLF layer. A multilayer extending via extends from the first into the second RLF layer. A first vertical FET has a side flipchip attached to a bottom side of the second RLF. A second vertical FET has a side flipchip attached to a bottom side of the second RLF layer, and contacts the multilayer extending via. A controller integrated circuit (IC) is flipchip attached a top side of the MRLF substrate at least partially over the first vertical FET. A top mold compound is on a top side of the MRLF substrate lateral to the controller IC that is lateral to a metal pad on the multilayer extending via. A bottom side of the first and second vertical FET are exposed by a bottom mold compound layer.

20 Claims, 7 Drawing Sheets

STACKED DIE MULTICHIP MODULE PACKAGE

FIELD

This Disclosure relates to stacked die multichip module (MCM) packages including a package substrate and a plurality of vertical power devices including at least one vertical power transistor.

BACKGROUND

MCM structures include two or more die, and can include other semiconductor components mounted within a single semiconductor package. The number of die and other components such as discrete capacitors can be mounted vertically, laterally, or a combination of vertical and lateral.

Some MCM devices comprise vertically stacked devices. Stacked die MCM devices are common arrangements for some power devices, such as for power converters. One known package arrangement stacks a controller integrated circuit (IC) on a vertical power field effect transistor (FET) to enhance the power density. One particular MCM power package includes a controller IC including a gate driver and a first and a second vertical power Metal Oxide Semiconductor FET (MOSFETs), hereafter a "vertical power FET", where the MCM power package includes clips for some of its internal connections. This MCM power package arrangement can implement a buck converter that has the gate driver of the controller IC coupled to drive the respective gates of the vertical power FETs.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognized stacked die MCM packages that use clips dissipate heat in multiple directions from the inside of the package from the semiconductor junctions of the devices to the outside of the package, which can result in poor thermal performance. For example, in a power stage MCM power converter package, fast switching power FETs also induce ringing over time, and when operated at relatively high frequency increase power losses that can significantly reduce the power conversion efficiency provided by the power converter.

The heat flows during stacked die MCM package operation are recognized to be constrained by different stacks of materials, generally being the silicon substrate of the die, the mold compound, and the metal clips, with the mold compound having the lowest thermal conductivity which can impair the dissipation of heat out from the package. Also, the integration of capacitors within the package to help reduce ringing during switching of the power FETs can also reduce the thermal performance of the overall stacked die MCM package.

A disclosed concept is to expose both the top side and the bottom side of the stacked die MCM package that includes at least one multilayer extending via by utilizing a multilayer routable lead frame (MRLF) substrate, with an IC exposed at the top side of the package, and the bottom components both being vertical devices having at least 3 terminals, with each side having at least one terminal, e.g., vertical transistors such as bipolars or FETs, that are directly exposed from the package for enabling contacting pads on a printed circuit board (PCB) which can act as a further heat dissipator. The multilayer extending via also provides a cooling path through the top of the power package from the top side of one of the vertical devices.

Disclosed aspects include an MCM package including an MRLF substrate including a first and a second RLF layer. A multilayer extending via extends from the first RLF layer into the second RLF layer. A first vertical device has a side including at least one terminal (e.g., its drain for a vertical MOSFET) flipchip attached to a bottom side of the second RLF. A second vertical device has a side having at least one terminal (e.g., its source for a vertical MOSFET) flipchip attached to a bottom side of the second RLF layer, and contacts the multilayer extending via. An integrated circuit (IC) is flipchip attached a top side of the MRLF substrate at least partially over the first vertical device. A top mold compound layer is on the top side of the MRLF substrate lateral to the IC and to a metal pad on the multilayer extending via. A bottom side of the first and the second vertical device are exposed by a bottom mold compound layer.

BRIEF DESCRIPTION OF THE DRAWINGS

Reference will now be made to the accompanying drawings, which are not necessarily drawn to scale, wherein:

FIGS. 4A-4E shows perspective views of an in-process stacked die MCM package shown by example as a stacked die MCM power package having a HS FET and a LS FET through the various steps of an example assembly flow.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1:
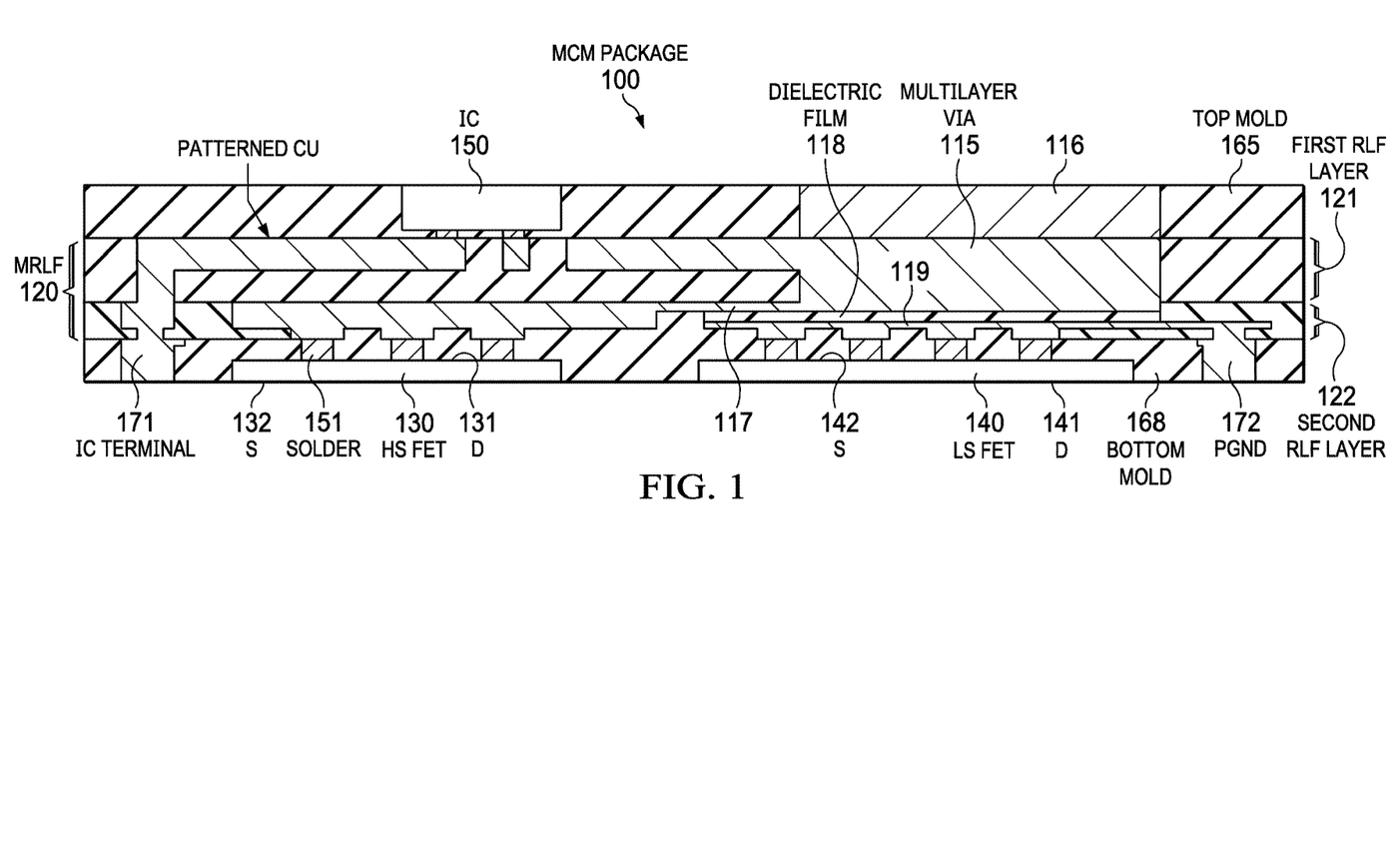
FIG. 1 is a cross-sectional view of an example stacked die MCM package shown as a power package including a multilayer build-up substrate shown as an MRLF substrate including a first RLF layer and a second RLF layer that features an exposed top and bottom portion, and also includes at least one multilayer extending via.

FIG. 1 is a cross-sectional view of an example stacked die MCM package 100 shown by example as an MCM power package including an MRLF substrate 120 that includes a first RLF layer 121 and a second RLF layer 122, where the MCM package 100 features an exposed top and bottom portion, and also includes at least one multilayer extending via 115. MCM package 100 is shown as a leadless power package. However, the MCM package 100 may also be a leaded package.

The MCM package 100 besides a power package may also comprise a radio frequency (RF) device MCM package. An example RF device MCM package implements a wireless RF transceiver module. In this example, an RF transceiver chip may be mounted on a silicon substrate which, as part of its circuitry, includes embedded capacitors, inductors and resistors. Another example MCM package besides a power package is high-power communication device package.

An IC 150 that in the case of an MCM power package generally comprises a controller IC is flipchip mounted has its bottom side exposed at the top of the package, and a terminal of both vertical devices shown as power FETs being shown as an HS FET 130 and LS FET 140, with the exposed terminals being shown as source (S) 132 and drain (D) 141. These exposed terminals are both exposed on the bottom of the stacked die MCM package 100 for enabling electrically and thermally contacting metal pads on a PCB which can act as an additional heat dissipator during MCM package 100 operation.

The terminal shown as S 142 of the LS FET 140 is capacitively coupled by a dielectric film 118 to the multilayer extending via 115 that has a metal top pad 116 for dissipating heat generated during MCM package operation out through the top of the MCM package 100. The multilayer extending via 115 includes a metal portion 117 of the second RLF layer 122 that is over the dielectric film 118 which can comprise a particular build-up dielectric film known as an ABF film commercially available from Ajinomoto Co, Inc. known to comprise an epoxy resin together with a phenolic hardener. The dielectric layer 118 is over another metal portion 119 of the second RLF layer 122. The material for the dielectric layer 118 generally has a room temperature thermal conductivity of at least 1 W/m·K, typically a room temperature thermal conductivity of at least 3 W/m·K, such as 3 to 10 W/m·K.

The metal portion 117, the dielectric layer 118, and the metal portion 119 together form a series capacitor that helps reduce ringing during switching of the MCM package 100, where the dielectric layer 118 is over the metal portion 119, and is under the metal portion 117 lateral to the multilayer via 115 on a side of the HS FET 130. The gate contact for the gate of the HS FET 130 and for the gate of the LS FET 140 are both not shown in FIG. 1 because FIG. 1 is side cross-sectional view where the respective gate contacts are on the other side, whereas the perspective view in FIG. 3A and FIG. 4A described below each show the gate connections as G-HS 133 and G-LS 143. The MCM package 100 also includes at least one IC terminal 171 and a power ground (PGND) terminal 172, which are also shown in FIG. 1.

As known in the art, respective layers of a build-up substrate (e.g., an MRLF substrate 120) can utilize a dielectric material such as an ABF film, where the build-up process generally includes metal plating, metal patterning, compression molding with an ABF film, and then grinding, with this sequence repeated for each of the RLF layers. Such a process may comprise laser processing and direct copper plating of its surface to form micrometer-scale circuit features, such as shown in the first RLF layer 121 and second RLF layer 122 shown in FIG. 1 and FIG. 2. A substrate supplier can fabricate a customized MRLF substrate based on a particular MRLF design provided to them by an MCM package designer, such as for the MRLF substrate 120.

Figure 2:
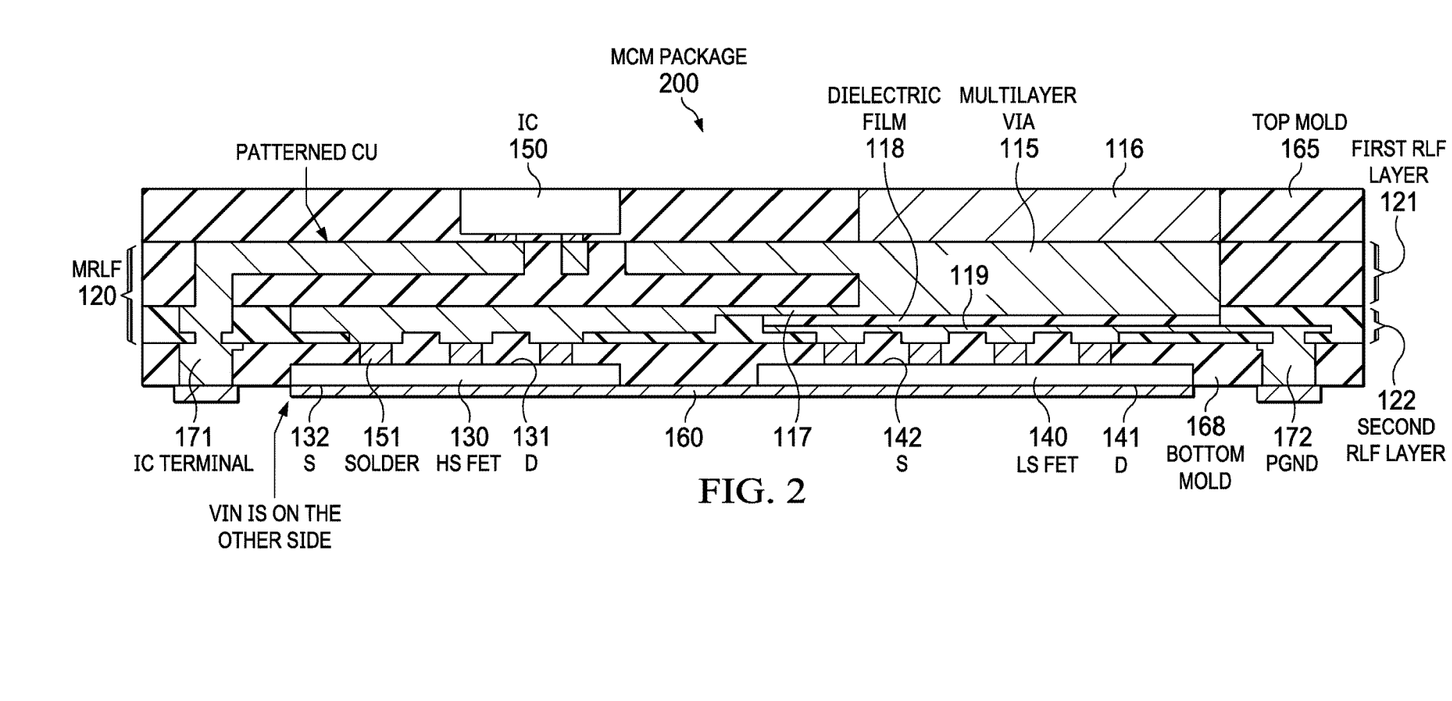
FIG. 2 is a cross-sectional view of the example stacked die MCM package shown in FIG. 1 having an added electrically conductive connector on the bottom side of the package for coupling together a terminal of the first vertical device shown as a source of the HS FET to a terminal of the second vertical device shown as the drain of the LS FET, to provide a switch node for the device shown as SW in FIG. 3D which shows a circuit schematic of a buck regulator having a controller IC coupled to drive the respective gates of the vertical FETs as described below.

FIG. 2 is a cross-sectional view of the example stacked die MCM package 100 shown in FIG. 1 now shown as MCM package 200 having an added electrically conductive connector 160 on the bottom side of the package for coupling together the S 132 of the HS FET 130 to the D 141 of the LS FET 140 to provide a switch node for the device shown as SW 174 in FIG. 3D described below. The electrically conductive connector 160 generally comprises a metal or metal alloy, and can comprise solder or a metal layer such as copper that can be formed as a plated layer. A typical thickness range for the electrically conductive connector 160 is between 50 to 100 μm.

Figure 3A:
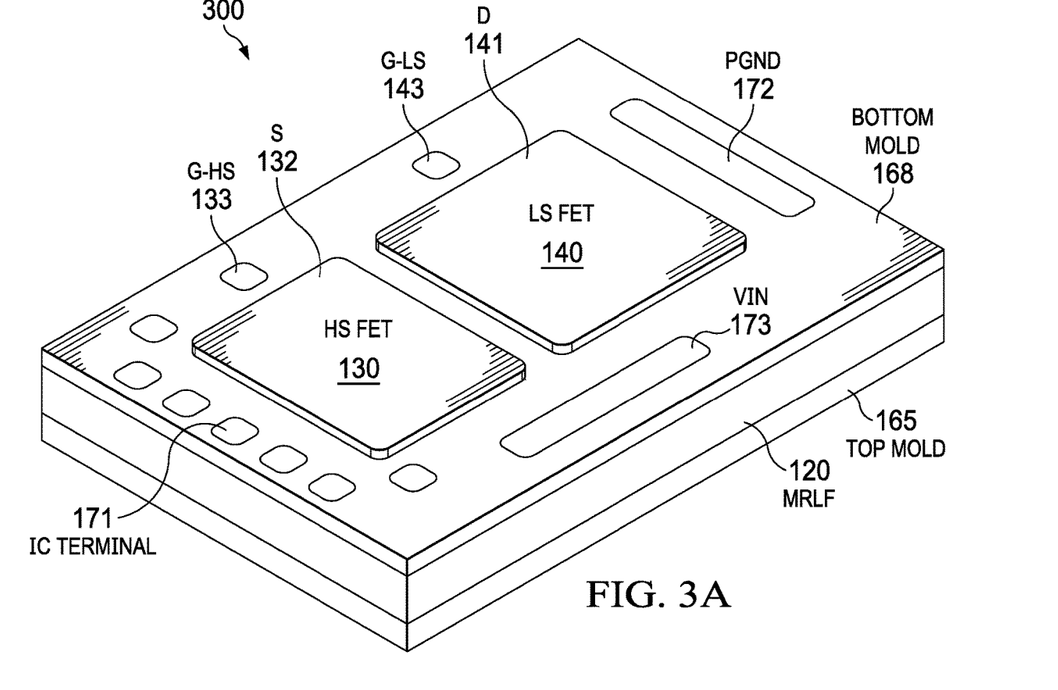
FIG. 3A shows a perspective bottom view of an example stacked die MCM power package including an MRLF substrate.
Figure 3B:
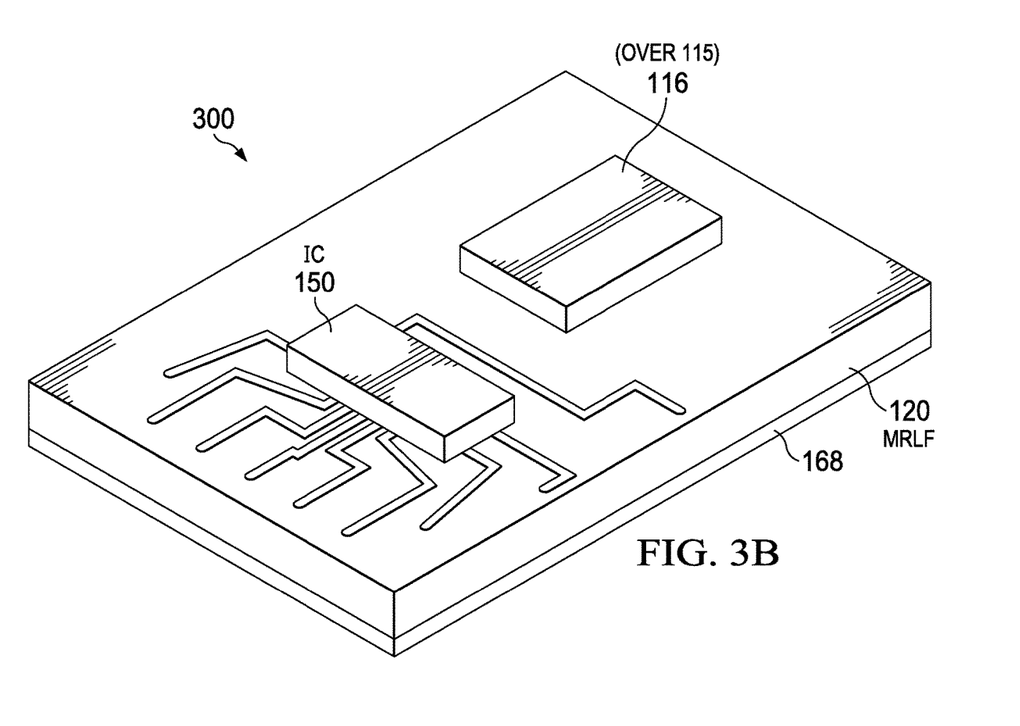
FIG. 3B is a perspective top view of the example stacked die MCM power package including the RLF substrate with the top mold compound removed.

FIG. 3A shows a perspective bottom side view of an example stacked die MCM power package 300 including an MRLF substrate 120, and FIG. 3B is a perspective top view of the example stacked die MCM power package including the MRLF substrate 120 with the top mold compound layer 165 removed, but having the bottom mold compound layer 168 shown the $V_{IN}$ terminal 173, as well as the G-HS terminal 133, and G-LS terminal 143 that can all be seen in FIG. 3A.

Figures 3C, 3D:
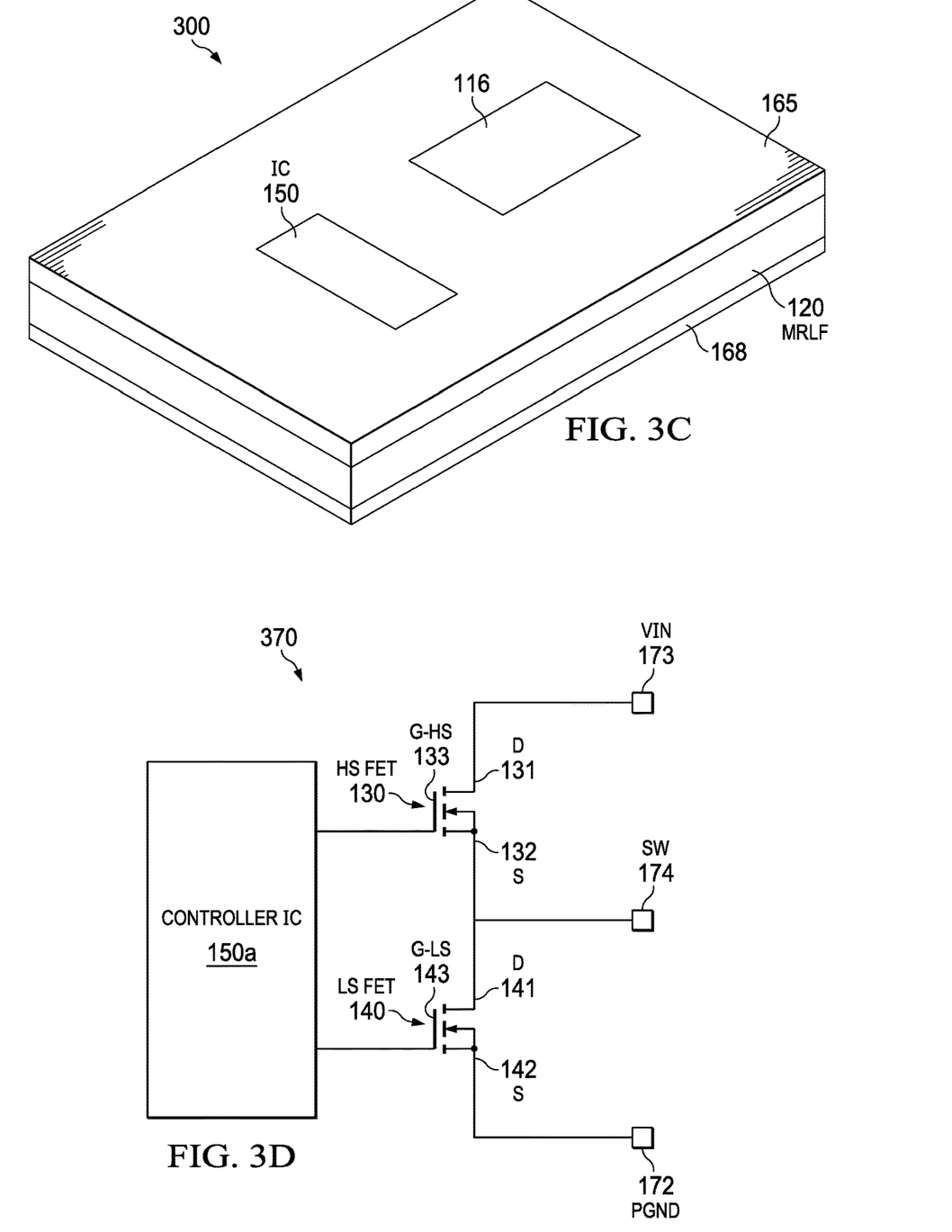
FIG. 3C is a perspective top view of the example stacked die MCM power package including a multilayer extending via with the top mold compound shown.
FIG. 3D shows an equivalent buck converter circuit that is implemented by the stacked die MCM power package, where the vertical power FET devices are both shown as n-channel devices, that generally comprise silicon-based devices.

FIG. 3C is a perspective top view of the example stacked die MCM package 300 including an MRLF substrate 120 with the top mold compound layer 165 shown, where the bottom side of the IC 150 and the metal top pad 116 can both be seen to be exposed. FIG. 3D shows an equivalent buck converter circuit 370 that can be implemented by the stacked die MCM package when it is an MCM power package. For the buck converter circuit 370 the IC is a controller IC now shown as 150a that includes a gate driver which is coupled to drive the respective FET gates, for the G of the LS FET again shown as G-LS 143, and for the G of the HS FET again shown as G-HS 133. The switch node (SW) of the buck converter circuit 370 is shown as 174.

Figure 4A:
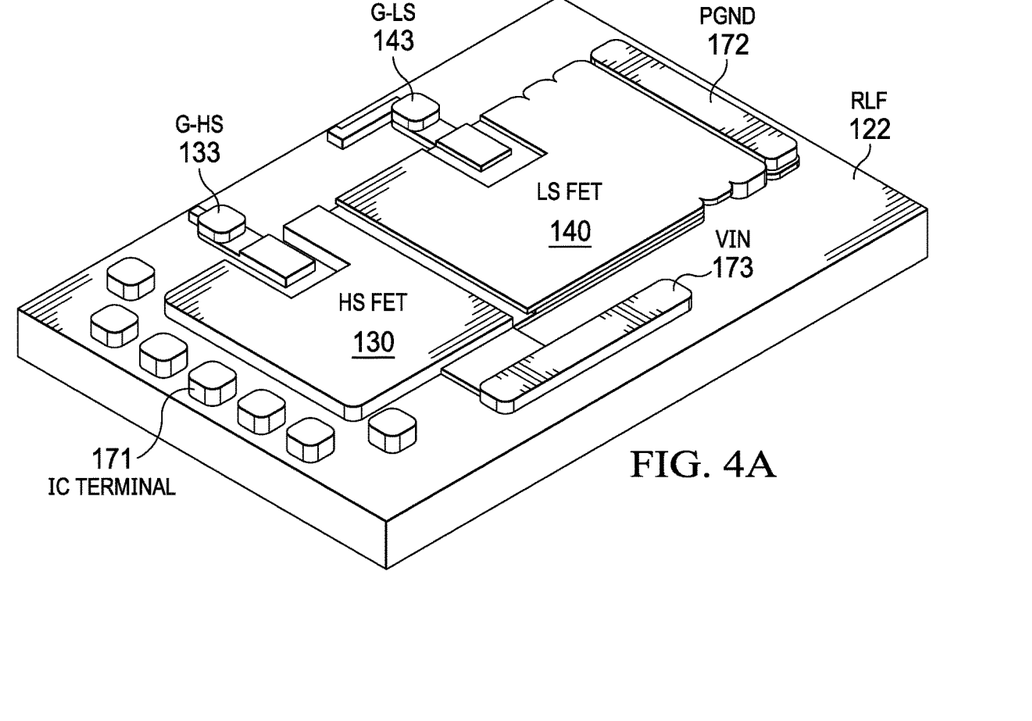
FIG. 4A is a bottom view of a disclosed MRLF that shows the bottom of the second RLF layer showing metal and metal pads for providing a connection with a series capacitor (not shown; see FIGS. 1 and 2) that is between the drain of the HS FET and the source of the LS FET.

FIGS. 4A-4E show perspective views of an in-process MCM package shown by example as a stacked die MCM power package through the various steps of an example assembly flow. FIG. 4A is a bottom view of a disclosed MRLF substrate 120 that shows the bottom side of the second RLF layer 122.

Figure 4B:
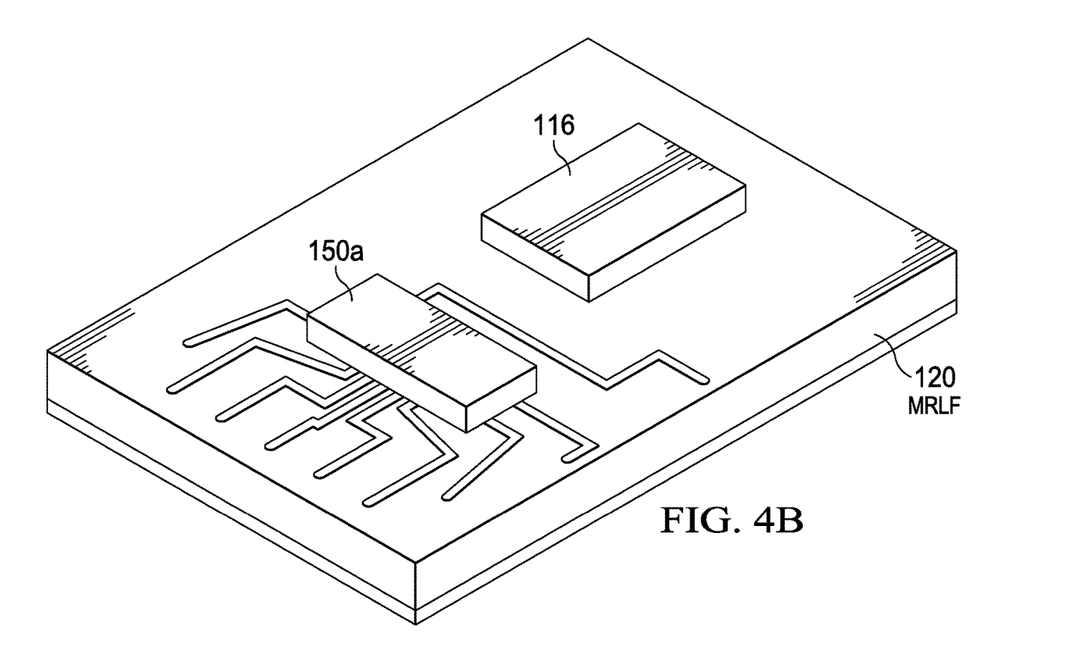
FIG. 4B shows a top perspective view of the in-process stacked die MCM power package after flip mounting an IC shown as the controller IC in FIG. 1.
Figure 4C:
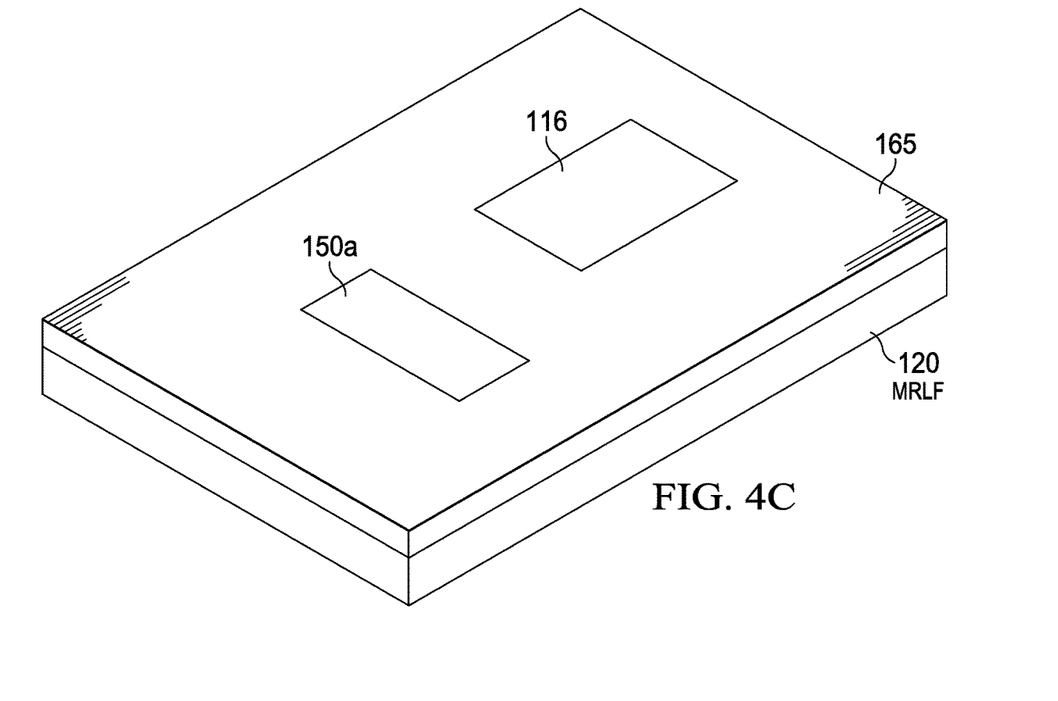
FIG. 4C shows a top perspective view of the result for the in-process MCM power package after topside molding to form a top mold compound layer as also shown in FIG. 1 and then exposing the IC and the metal plate that is on the multilayer extending via.

FIG. 4B shows a top perspective view of the in-process stacked die MCM power package after flipchip mounting an IC shown as the controller IC 150a in FIG. 3D. FIG. 4C shows a top perspective view of the result for the in-process MCM power package after top side molding to form a top mold compound layer 165 as also shown in FIG. 1, and then exposing the controller IC 150 and the metal top pad 116 that is on top of the multilayer extending via 115. The exposing can comprise a grinding process or a film-assisted molding process to provide exposed portions of the mold layer to avoid the need for grinding.

Figure 4D:
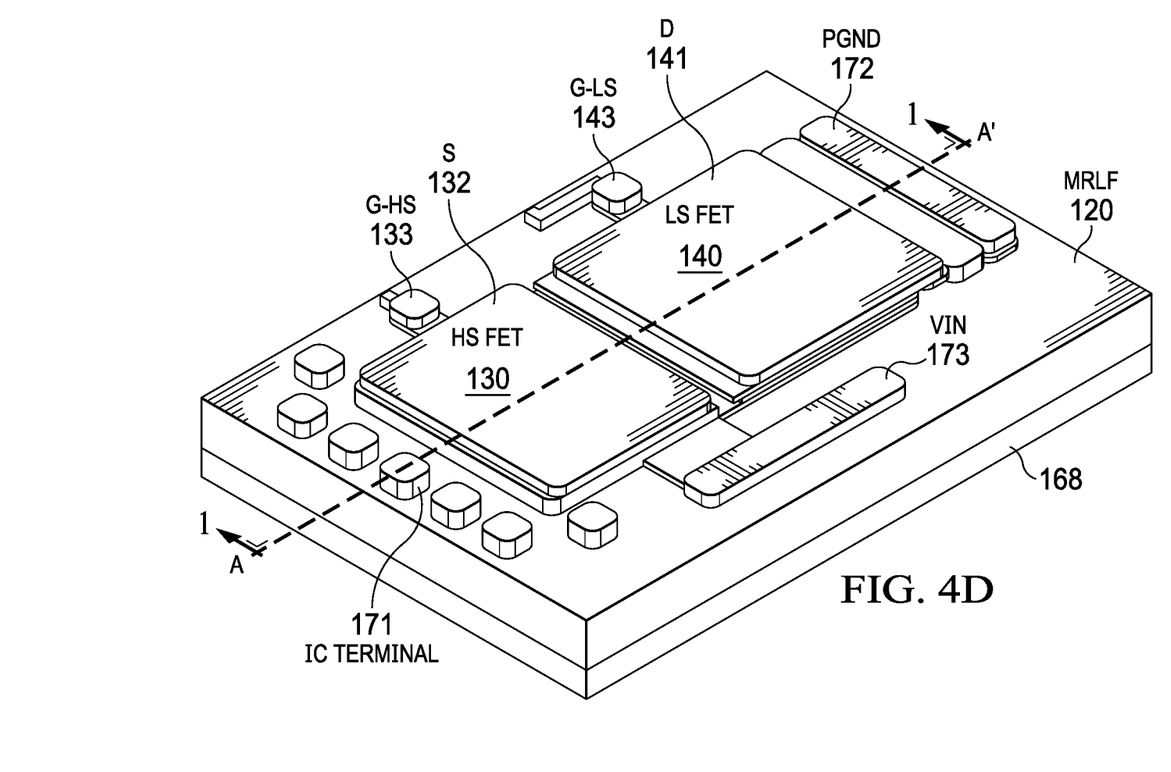
FIG. 4D shows a bottom perspective view of the in-process MCM power package after flip attaching the first vertical FET and the second vertical FET including over the metal and metal pads.
Figure 4E:
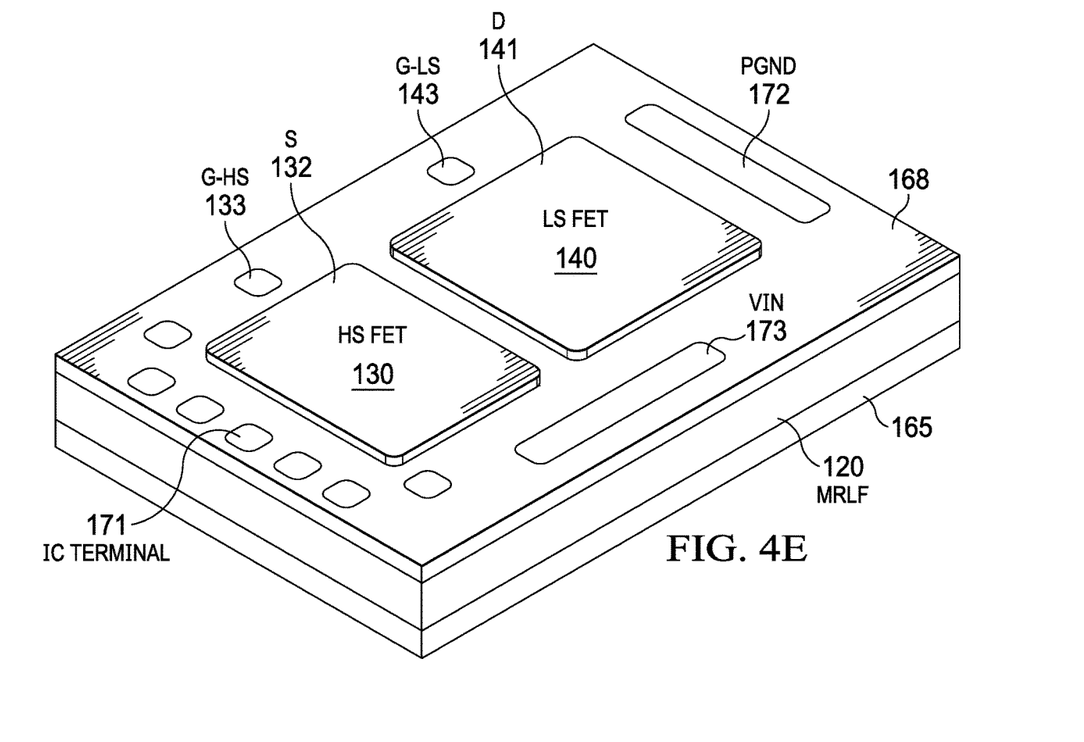
FIG. 4E shows a bottom perspective view of the in-process stacked die MCM power device after a molding or an encapsulation process to form a such a layer on the bottom side of the stacked die MCM power package.

FIG. 4D shows a bottom perspective view of the in-process MCM power package after flipchip attaching the first vertical power FET and the second vertical power FET shown as HS FET 130 and LS FET 140, over the metal 117 shown in FIG. 1. The cut line shown as A-A' in FIG. 4D is the basis for the cross-sectional view shown in FIG. 1. FIG. 4E shows a bottom perspective view of the in-process stacked die MCM power package after a molding or an encapsulation process to form a such a layer shown as bottom mold layer 168 on the bottom side of the package. One can use grinding or some other mold removal process to expose the bottom side of the FET die 130, 140, after molding, or use a film assisted molding to prevent mold intrusion. A strip (or panel) of such stacked die MCM power packages are then generally electrically tested, followed by package singulation to provide a plurality of disclosed stacked die MCM packages.

Disclosed aspects can be integrated into a variety of assembly flows to form a variety of different MCM packages and related products. The semiconductor die including the IC may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

EXAMPLES

Disclosed aspects are further illustrated by the following specific Examples, which should not be construed as limiting the scope or content of this Disclosure in any way.

A simulation was performed to compare a control MCM power package comprising a power stage non-dual cool device (where only the bottom side of the package is the thermally exposed part, where the top side is not exposed), a power stage dual-cool device (meaning both the top and bottom side of the MCM package are exposed, providing a dual path for a thermally efficient package), and a disclosed MCM power package. The MCM power package was based on the MCM package 100 shown in FIG. 1 including a 2 layer MRLF substrate with an exposed IC 150 on the topside and exposed heat slug (shown above as metal top pad 116) where the heat from the HS FET 130 and LS FET 140 can be efficiently dissipated out of the MCM package including on the bottom side of the package through direct PCB board contact to a metal shown as above as metal contact layer 160 that is connected to the SW node of the device.

The junction temperature for the HS FET and the LS FET and the $R_{th\_Jc}$, which is the thermal resistance were J means a junction and C means a case, were the simulated parameters. The MCM power packages all included a standard epoxy mold compound for their top and bottom mold compound. The power stage non-dual cool MCM power package showed a junction temperature of 112° C., and a $R_{th\_JC}$ (in ° C./W) of 7.4. The power stage dual-cool MCM power package had a junction temperature of 90° C. and a $R_{th\_JC}$ of 1.5. The disclosed MCM power package including an MRLF substrate with an exposed IC and exposed vertical FETs (following the MCM package 100 shown in FIG. 1 described above) had a junction temperature estimated at 80° C. and an $R_{Th\_JC}$ of <1 estimated to be about 0.5 which is significantly reduced because both of the FET die make a direct contact through the metal contact layer 160 directly contacting metal pads on the PCB.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A multichip module (MCM) package, comprising:
    a multilayer routable lead frame substrate (MRLF substrate) including a first routable lead frame (RLF) layer and at least a second RLF layer, the MRLF substrate having a top side and a bottom side with a multilayer extending via extending from a top side of the first RLF layer at least into the second RLF layer;
    a first vertical device, wherein a side of the first vertical device is flipchip attached to a bottom side of the second RLF layer;
    a second vertical device, wherein a side of the second vertical device is flipchip attached to the bottom side of the second RLF layer lateral to the first vertical device and is contacting the multilayer extending via;
    an integrated circuit flipchip attached to the top side of the MRLF substrate positioned at least partially over the first vertical device;
    a top mold compound on the top side of the MRLF substrate lateral to a metal pad on the multilayer extending via, and
    a bottom mold compound layer on the bottom side of the second RLF layer, wherein a bottom side of the first vertical device and a bottom side of the second vertical device are both exposed by the bottom mold compound layer.

2. The MCM package of claim 1, wherein the first vertical device comprises a first vertical power field effect transistor (FET) and wherein the second vertical device comprises a second vertical power FET, further comprising a dielectric layer within the second RLF layer for isolation between a source of the second vertical power FET and a drain of the first vertical power FET.

3. The MCM package of claim 2, further comprising a metal contact layer coupling a drain of the second vertical power FET to a source of the first vertical power FET to provide a switching node for the MCM package.

4. The MCM package of claim 1, wherein the metal pad comprises copper.

5. The MCM package of claim 2, wherein the second RLF layer includes a connection for providing a node that capacitively couples together a drain of the first vertical power FET and a source of the second vertical power FET.

6. The MCM package of claim 1, wherein a dielectric for the first RLF layer and the second RLF layer each provide a 25° C. thermal conductivity of at least 1 W/m·K.

7. The MCM package of claim 1, wherein the first vertical power FET and the second vertical power FET both comprise silicon-based n-channel devices.

8. The MCM package of claim 1, wherein the MCM power package comprises a leadless package.

9. A multichip module (MCM) power package, comprising:
a multilayer routable lead frame substrate (MRLF substrate) including a first routable lead frame (RLF) layer and at least a second RLF layer, the MRLF substrate having a top side and a bottom side with a multilayer extending via extending from a top side of the first RLF layer at least into the second RLF layer;
a first vertical power field effect transistor (FET) including a first drain and a first source, wherein a side of the first vertical power FET is flipchip attached to a bottom side of the second RLF layer;
a second vertical power (FET) including a second drain and a second source, wherein a side of the second vertical power FET having the second source is flipchip attached to the bottom side of the second RLF layer lateral to the first vertical power FET and is contacting the multilayer extending via;
a controller integrated circuit (IC) including a gate driver flipchip attached to the top side of the MRLF substrate positioned at least partially over the first vertical power FET;
a top mold compound on the top side of the MRLF substrate lateral to the controller IC and lateral to a metal pad on the multilayer extending via, and
a bottom mold compound layer on the bottom side of the second RLF layer, wherein a bottom side of the first vertical power FET and the second vertical power FET are both exposed by the bottom mold compound layer.

10. The MCM power package of claim 9, further comprising a dielectric layer within the second RLF layer for isolation between the second source and the first drain.

11. The MCM power package of claim 9, further comprising a metal contact layer coupling the second drain to the first source to provide a switching node for the MCM power package.

12. The MCM power package of claim 9, wherein the second RLF layer includes a connection for providing a node that capacitively couples together the first drain and the second source.

13. A multichip module (MCM) packaging method, comprising:

flipchip attaching an integrated circuit (IC) onto a two-dimensional (2D) array of multilayer molded routable lead frame substrates (MRLF substrate) each including a first routable lead frame (RLF) layer and at least a second RLF layer having a top side and a bottom side including a multilayer extending via that extends from the top side at least into the second RLF layer;
forming a metal pad over the multilayer extending via;
molding to form a top mold compound layer on the second RLF layer to expose the IC and the metal pad;
flipchip attaching a first vertical device and a second vertical device to the bottom side of the second RLF layer;
molding to form a bottom mold compound layer on the bottom side of the second RLF layer after the flipchip attaching, wherein bottom sides of the first and second vertical devices are exposed by the bottom mold compound layer, and
singulating the array of MRLF substrates to generate a plurality of stacked die MCM power packages.

14. The method of claim 13, wherein the first vertical device comprises a first vertical power field effect transistor (FET) and wherein the second vertical device comprises a second vertical power FET, further comprising a dielectric layer within the second RLF layer for isolation between a source of the second vertical power FET and a drain of the first vertical power FET.

15. The method of claim 14, further comprising forming a metal contact layer coupling a drain of the second vertical power FET to a source of the first vertical power FET to provide a switching node for the MCM package.

16. The method of 13, wherein the metal pad comprises copper.

17. The method of claim 13, further comprising forming the second RLF layer including positioning a dielectric layer between a drain of the first vertical power FET and a source of the second vertical power FET.

18. The method of claim 13, wherein at least one of the molding to form the top mold compound layer and wherein the molding to form the bottom mold compound layer comprises a film assisted molding process.

19. The method of claim 13, wherein a dielectric material for the first RLF layer and the second RLF layer each provide a 25° C. thermal conductivity of at least 1 W/m·K.

20. The method of claim 14, wherein the first vertical power FET and the second vertical power FETs both comprise silicon-based n-channel devices.

* * * * *